US007653982B2

(12) United States Patent
Chopra et al.

(10) Patent No.: US 7,653,982 B2
(45) Date of Patent: Feb. 2, 2010

(54) INDIVIDUALLY UNIQUE HYBRID PRINTED ANTENNAE FOR CHIPLESS RFID APPLICATIONS

(75) Inventors: Naveen Chopra, Oakville (CA); Peter M. Kazmaier, Mississauga (CA); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 23 days.

(21) Appl. No.: 11/941,570

(22) Filed: Nov. 16, 2007

(65) Prior Publication Data
US 2009/0128290 A1 May 21, 2009

(51) Int. Cl.
| B05D 5/12 | (2006.01) |
| H01P 11/00 | (2006.01) |
| H01Q 1/36 | (2006.01) |
| H01Q 13/00 | (2006.01) |
| H05K 3/02 | (2006.01) |
| H05K 3/20 | (2006.01) |

(52) U.S. Cl. ............................ 29/600; 29/601; 29/831; 29/846; 343/895; 427/98.4

(58) Field of Classification Search ................... 29/600, 29/601, 846, 831; 343/895; 340/10.1; 427/98.4
See application file for complete search history.

(56) References Cited

U.S. PATENT DOCUMENTS

| 4,862,160 | A | | 8/1989 | Ekchian et al. | |
| 5,781,110 | A | * | 7/1998 | Habeger et al. | 340/572.5 |
| 6,031,458 | A | * | 2/2000 | Jacobsen et al. | 340/572.5 |
| 6,198,393 | B1 | * | 3/2001 | Rasband | 340/572.5 |
| 6,300,914 | B1 | * | 10/2001 | Yang | 343/741 |
| 6,737,204 | B2 | | 5/2004 | Swihart | |
| 2005/0275540 | A1 | * | 12/2005 | Halope et al. | 340/572.8 |

FOREIGN PATENT DOCUMENTS

| GB | 2 409 318 A | 6/2005 |
| WO | WO 98/09262 | 3/1998 |
| WO | WO 00/72255 A1 | 11/2000 |

* cited by examiner

*Primary Examiner*—David P Bryant
*Assistant Examiner*—Alexander P Taousakis
(74) *Attorney, Agent, or Firm*—Oliff & Berridge, PLC

(57) ABSTRACT

A method of printing chipless RFID tags with unique features, includes printing a RFID antenna pattern precursor using a first printing process, wherein the RFID antenna pattern precursor includes a plurality of disconnected wire segments; and printing a conductive ink using a second print process to interconnect at least two of the plurality of disconnected wire segments, to produce a final RFID antenna with a unique antenna geometry.

11 Claims, 3 Drawing Sheets

INDIVIDUALLY UNIQUE HYBRID PRINTED ANTENNAE FOR CHIPLESS RFID APPLICATIONS

TECHNICAL FIELD OF THE INVENTION

This invention relates to printing unique printed antennae using a hybrid analog/digital printing system.

BACKGROUND

Recently, radio frequency identification (RFID) technology has gained tremendous popularity as a device for storing and transmitting information. RFID technology utilizes a tag transponder, which is placed on an object, and a reader, also referred to herein as an interrogator, to read and identify the tag. RFID technologies are broadly categorized as using either "active" tags or "passive" tags. Active tags have a local power source (such as a battery) so that the active tag sends a signal to be read by the interrogator. Active tags have a longer signal range. "Passive" tags, in contrast, have no internal power source. Instead, passive tags derive power from the reader, and the passive tag re-transmits or transponds information upon receiving the signal from the reader. Passive tags have a much shorter signal range (typically less than 20 feet).

Both categories of tags have an electronic circuit that is typically in the form of an integrated circuit or silicon chip. The circuit stores and communicates identification data to the reader. In addition to the chip, the tag includes some form of antenna that is electrically connected to the chip. Active tags incorporate an antenna that communicates with the reader from the tag's own power source. For passive tags, the antenna acts as a transducer to convert radio frequency (RF) energy originating from the reader to electrical power. The chip then becomes energized and performs the communication function with the reader.

On the other hand, a chipless RFID tag has neither an integrated circuit nor discrete electronic components, such as the transistor or coil. This feature allows chipless RFID tags to be printed directly onto a substrate at lower costs than traditional RFID tags.

As a practical matter, RFID technology uses radio frequencies that have much better penetration characteristics to material than do optical signals, and will work under more hostile environmental conditions than bar code labels. Therefore, the RFID tags may be read through paint, water, dirt, dust, human bodies, concrete, or through the tagged item itself. RFID tags may be used in managing inventory, automatic identification of cars on toil roads, security systems, electronic access cards, keyless entry and the like.

Antennae are an element of RFID tags that are typically prepared via stamping/etching techniques, wherein a foil master is carved away to create the final structure. The RFID antenna may also be printed directly on the substrate using a conductive metal ink. The ink is printed on a substrate, followed by high temperature sintering in order to anneal the particles and to create a conductive line on the substrate. Alternatively, metal fibers may be incorporated directly into the substrate. For example, one chipless RFID technology from Inkode® Corp. uses embedded aluminum fibers that are embedded into paper. The aluminum fibers must be cut to the appropriate wavelength (¼ wavelength) and be incorporated into the paper fibers as a furnish additive during the paper-making process. Therefore, the Inkode® method is costly and tedious.

Although particulate metal materials may be used, the superior characteristics of nanoparticle metal materials in ink applications yields a better product. Metallic nanoparticles are particles having a diameter in the submicron size range. Nanoparticle metals have unique properties, which differ from those of bulk and atomic species. Metallic nanoparticles are characterized by enhanced reactivity of the surface atoms, high electric conductivity, and unique optical properties. For example, nanoparticles have a lower melting point than bulk metal, and a lower sintering temperature than that of bulk metal. The unique properties of metal nanoparticles result from their distinct electronic structure and from their extremely large surface area and high percentage of surface atoms.

Metallic nanoparticles are either crystalline or amorphous materials. They can be composed of pure metal, such as silver, gold, copper, etc., or a mixture of metals, such as alloys, or core of one or more metals such as copper covered by a shell of one or more other metals such as gold or silver. The nozzles in an inkjet printing head are approximately 1 µm in diameter. In order to jet a stream of particles through a nozzle, the particles' size should be less than approximately one-tenth of the nozzle diameter. This means that in order to inkjet a particle, its diameter must be less than about 100 nm.

Nickel has been used for conductive inks for a very limited extent because of its relatively low conductivity (approximately four times less than that of copper). Gold and silver can provide good conductivity, but are relatively expensive. Moreover, gold and silver require high temperatures for annealing, which can pose a challenge for printing on paper and plastic substrates. Copper provides good conductivity at a low price (about one percent of that of silver). Unfortunately, copper is easily oxidized and the oxide is non-conductive.

Copper-based nanoparticle inks are unstable and require an inert/reducing atmosphere during preparation and annealing in order to prevent spontaneous oxidation to non-conductive CuO or $Cu_2O$. Copper polymer thick film (PFT) inks have been available for many years and can be used for special purposes, for example, where solderability is required. Another interesting strategy is to combine the advantages of both silver and copper. Silver plated copper particles are commercially available, and are used in some commercially available inks. Silver plating provides the advantages of silver for inter-particle contacts, while using the cheaper conductive metal (copper) for the bulk of the particle material. Thus, the only reliable means of preparing copper antennae is via electroplating on an existing metal surface.

Hybrid printing technology combines analog printing processes (such as offset lithography, flexography, etching, and letterpress printing) with digital printing processes (such as inkjet printing). In hybrid printing processes, inkjet printing is one particularly suitable digital printing method, because it can easily be integrated with other processes and machines. Hybrid printing technology has been used, for instance, to customize marketing material. An analog process is used to print the marketing material itself, while a digital process is used to add information only relevant to individual consumers.

Hybrid printing systems offer numerous advantages, for example, the high quality color production of analog methods and the fully variable printing capability of digital technology. Additionally, the workflow and job processing improvements that hybrid printing enables can have a significant economic impact on a plant's operations. Because hybrid systems enables a job to be completed, from a blank substrate to a finished product, in a single operation, hybrid systems minimizes material handling steps, work-in-process inventories, and a lot of labor that typically goes into such jobs when run in multiple steps. This, in turn, saves time and money, while reducing waste and drastically reducing the need for inventories.

U.S. Pat. No. 6,737,204 B2 to Swihart describes creating a hybrid digital/analog image, wherein an analog image is formed directly on a digitally generated image.

A printed antenna is one path towards chipless RFID tags, but the challenge lies in printing many RFID with unique features for item-level tagging. One method of creating RFID tags with unique features is to print each RFID tag individually via inkjet printing. However, this method is costly and highly time-consuming. Thus, there exists a need for a cheaper method of making RFID tags with unique features.

SUMMARY

The present disclosure provides for a method of printing chipless RFID tags with unique features, comprising: printing a RFID antenna pattern precursor using a first printing process, wherein the RFID antenna pattern precursor comprises a plurality of preprinted wire segments that constitute a majority of the RFID antenna pattern; and printing a conductive ink using a second printing process to interconnect at least two of said plurality of preprinted wire segments, to produce a final RFID chip with a unique antenna geometry.

The present disclosure also provides for a chipless RFID tag with unique features, comprised of: an RFID antenna precursor printed by a first printing process, wherein the RFID antenna pattern precursor comprises a plurality of preprinted wire segments that constitute a majority of the RFID antenna pattern; and a conductive ink printing printed by a second printing process, wherein the conductive ink interconnect at least two of the plurality of preprinted wire segments, to produce a final RFID chip with a unique antenna geometry.

There are numerous advantages to the present disclosure. Speedy and efficient mass production of RFID antenna masters is achieved via analog printing, as large numbers of identical master patterns can be created by using a fast printing process. Additionally, customization of each individual mass-produced RFID tag is achieved by digital printing. Furthermore, using the relatively slower digital process (for example, inkjet printing) to add just a few unique features will minimize the time lag for printing. Also, the use of inkjet printing allows for very fine variable features to be printed, thus widening the scope of unique features and materials that may be printed. For example, graphite inks and copper may be used. Conversely, printing of only small areas of the antenna with conductive ink (such as gold, for enhanced conductivity at the interconnections) saves considerable amount of money as when compared against printing an entire antenna. Thus, the ability to print a variable data RFID tag in large volumes at low cost is now possible for the first time.

DETAILED DESCRIPTION OF EMBODIMENTS

This disclosure is not limited to particular embodiments described herein, and some components and processes may be varied by one of ordinary skill in the art, based on this disclosure. The terminology used herein is for the purpose of describing particular embodiments only, and is not intended to be limiting.

In this specification and the claims that follow, singular forms such as "a," "an," and "the" include plural forms unless the content clearly dictates otherwise. In addition, reference may be made to a number of terms that shall be defined as follows:

The phrase "antenna geometry" refers to the overall design, including length, surface area, and geometric shape, of the antenna structure. The phrase "antenna geometry" thus generally only refers to the interconnected wiring segments, and excludes any non-connected wiring segments that may still be repent from the antenna master. However, in some embodiments where the non-connected wiring segments may affect the performance, such as frequency or response of the antenna, such non-connected wiring segments may still be considered part of the antenna geometry.

"RFID antenna pattern precursor" and "antenna master" refer to a plurality of disconnected segments, some or all of which segments may be subsequently connected to form a desired final antenna structure.

In general, the present disclosure provides a method of printing unique chipless RFID tags by inexpensively mass-producing non-unique RFID antenna pattern precursors (antenna masters) with preprinted wire segments, followed by turning the non-unique RFID antenna pattern precursors into desired unique RFID antenna patterns by interconnecting two or more of the preprinted wire segments. For example, in one embodiment, the present disclosure provides a method of printing unique chipless RFID tags by inexpensively mass-producing non-unique RFID antenna pattern precursors (antenna masters) with preprinted wire segments by an analog printing method. The non-unique RFID antenna pattern precursors are then generally turned into desired unique RFID antenna patterns, such as finished chipless RFID tags, by a digital printing method, such as inkjet printing. In the inkjet printing step, conductive ink is used to print unique marking onto the RFID antenna precursors to connect two or more of the preprinted wire segments. The antenna lengths (that is, the length of the antenna corresponding to interconnected wire segments) on the RFID tags vary, and the various antenna lengths correspond to unique resonance frequencies. After the wire segments are connected by the interconnects, the antenna loop is completed by printing a dielectric barrier over the wires, followed by a bridge wire joining the center terminus and the outside terminus. Therefore, the finished RFID tags will each have unique response determined by the antenna geometry formed by interconnection of specific wire segments of the antenna master.

Figure 1:
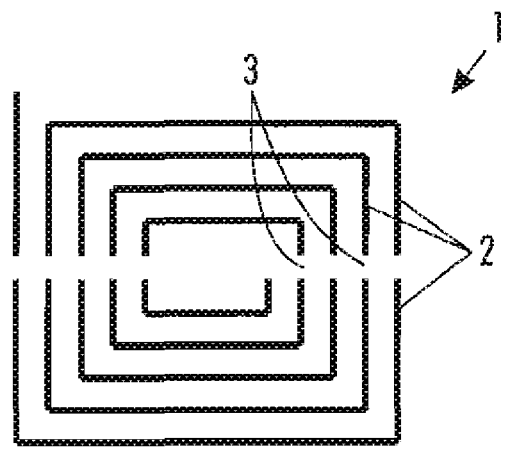
FIG. 1 is a depiction of an RFID master according to an embodiment of this disclosure.

For purposes of description only, FIGS. 1-5 depict the creation of a unique chipless RFID tag antenna according to one embodiment of the disclosure. FIG. 1 depicts a sample mass-produced antenna master produced, for example, via an analog printing method. The antenna master 1 is generally made up of a plurality of separate wire segments 2. Although FIG. 1 shows only ten separate wire segments 2, it is understood that the antenna master can have any number of separate wire segments, and those separate wire segments can be located in any spatial orientation. The separate wire segments 2 are separated by respective gaps 3 that, if two or more are interconnected, would extend the antenna length. In this manner, the bulk or majority of the antenna master pattern can be printed via an analog printing method. Unique features can then be added to the antenna master via, for example, digital printing in order to eventually create a finished chipless RFID tag with unique resonance frequency.

Figure 2:
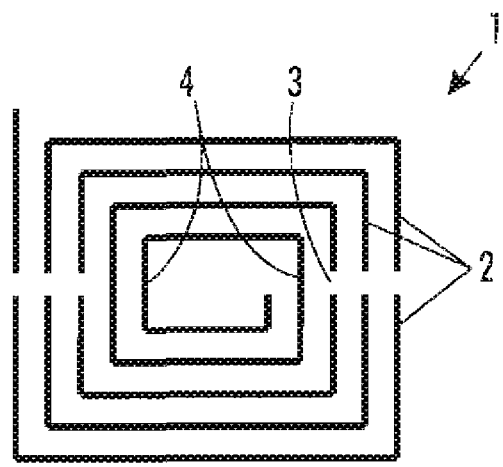
FIG. 2 is a depiction of the preprinted wires of the RFID master interconnected by printed interconnects to produce a small antenna.

FIG. 2 depicts one exemplary unfinished chipless RFID tag in its intermediate form, with a relatively small antenna geometry or antenna length. In FIG. 2, the antenna master 1 of FIG. 1 is digitally printed to connect wire segments 2 of the preprinted antenna master 1 by adding connecting segments 4 in desired antenna segment gaps 3. In this embodiment, three antenna segment gaps 3 are filled with connecting segments 4 to interconnect four of the ten wire segments 2 to thereby provide a relatively short antenna length. This accordingly provides to the antenna master a unique antenna geometry on the RFID tag precursor. The antennae length is inversely proportional to resonance frequency. Thus, the small antenna length corresponds to high resonance frequency. The antenna loop will be completed to produce a finished RFID tag (shown in FIG. 5). Therefore, the finished RFID tags will each have unique response determined by the antenna geometry formed by interconnection of specific wire segments of the antenna master.

Figure 3:
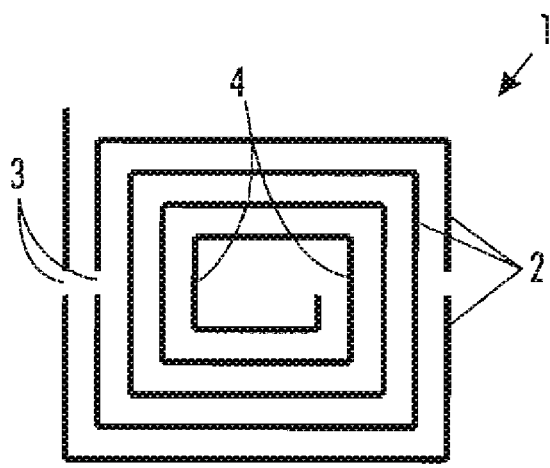
FIG. 3 is a depiction of the preprinted wires of the RFID master interconnected by printed interconnects to produce a medium antenna.

FIG. 3 depicts another exemplary unfinished chipless RFID tag in its intermediate form with a relatively medium antenna geometry or antenna length. In FIG. 3, the antenna master 1 of FIG. 1 is digitally printed to connect wire segments 2 of the preprinted antenna master 1 by adding connecting segments 4 in desired antenna segment gaps 3. In this embodiment, six antenna segment gaps 3 are filled with connecting segments 4 to interconnect seven of the ten wire segments 2 to thereby provide a relatively medium antenna length. This accordingly provides to the antenna master a unique antenna geometry on the RFID tag precursor. The medium antennae length corresponds to medium resonance frequency. The antenna loop will be completed to produce a finished RFID tag (shown in FIG. 5). Therefore, the finished RFID tags will each have unique response determined by the antenna geometry formed by interconnection of specific wire segments of the antenna master.

Figure 4:
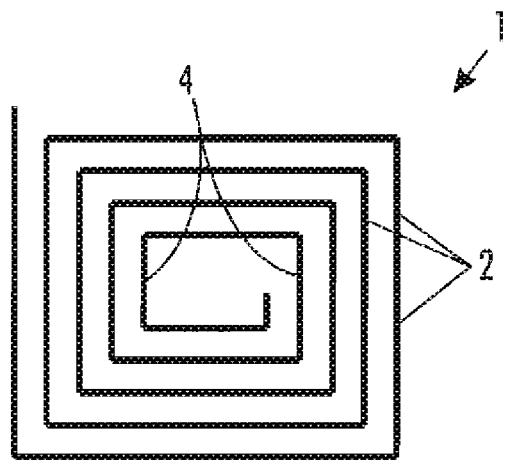
FIG. 4 is a depiction of the preprinted wires of the RFID master interconnected by printed interconnects to produce a large antenna.

FIG. 4 depicts one exemplary unfinished chipless RFID tag in its intermediate form with a relatively long antenna geometry or antenna length. In FIG. 4, the antenna master 1 of FIG. 1 is digitally printed to connect wire segments 2 of the preprinted antenna master 1 by adding connecting segments 4 in desired antenna segment gaps 3. In this embodiment, one antenna segment gaps 3 are filled with connecting segments 4 to interconnect all ten of the wire segments 2 to thereby provide a relatively long antenna length. This accordingly provides to the antenna master a unique antenna geometry on the finished RFID tag. The large antennae length corresponds to low resonance frequency. The antenna loop will be completed to produce a finished RFID tag (shown in FIG. 5). Therefore, the finished RFID tags will each have unique response determined by the antenna geometry formed by interconnection of specific wire segments of the antenna master.

Figure 5:
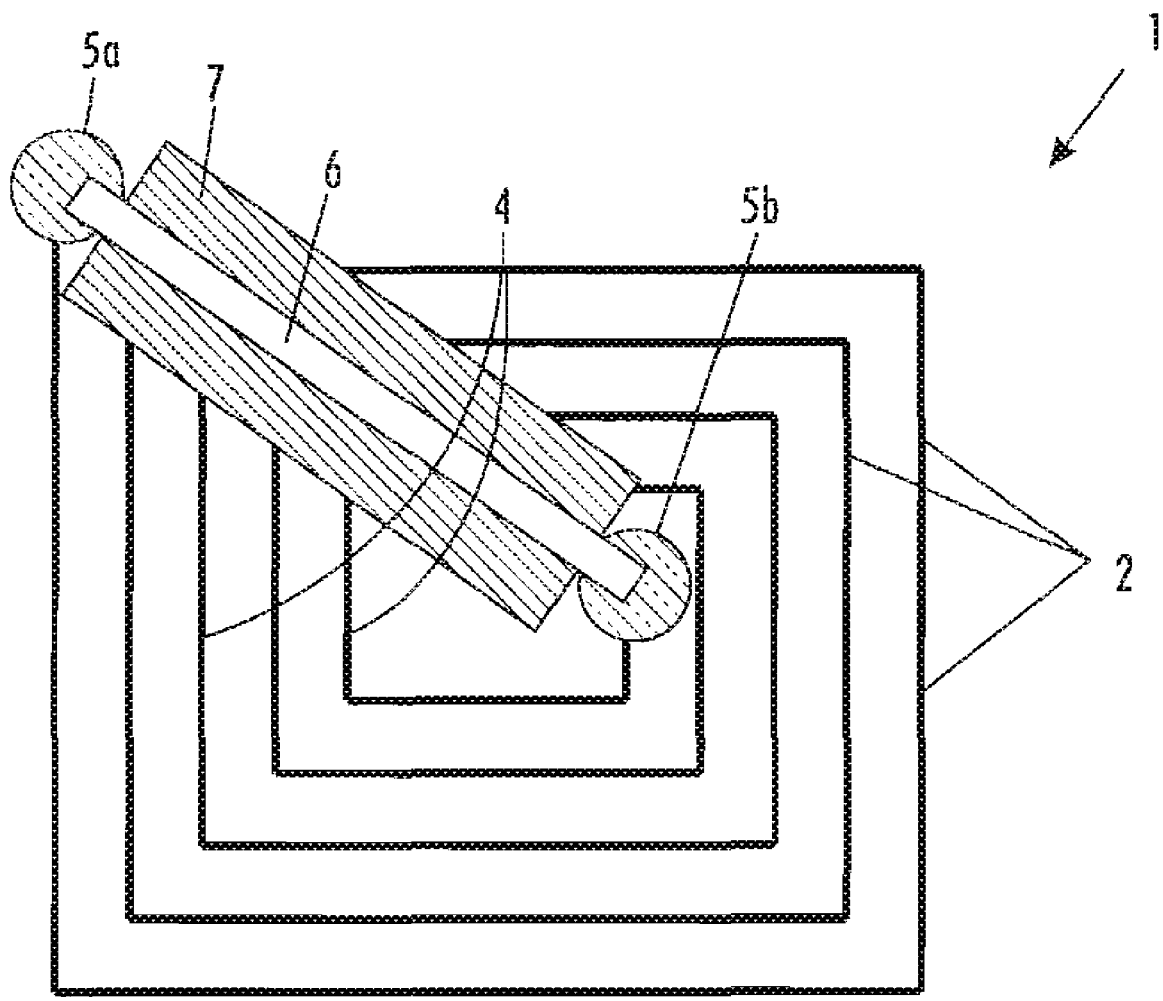
FIG. 5 is a depiction of a finished RFID tag with a large antenna.

FIG. 5 depicts one exemplary finished chipless RFID tag with a relatively long antenna geometry or antenna length. In FIG. 5, the wire segments 2 are connected by the connecting segments 4. The antenna loop is completed by printing a dielectric barrier 7 over the wires, followed by a bridge wire 6 joining the center terminus 5b and the outside terminus 5a.

The Antenna Master

The antenna master is a mass-produced precursor to a finished antenna product. Thus, the antenna master is a printed set of wire segments, which can be subsequently processed to provide a plurality of unique final antenna geometries.

In embodiments, the antenna master features the bulk of the antenna pattern. That is, in the interest of providing an economic antenna master that can be mass-produced and then specifically tailored to a number of different final antenna geometries, it is desired that the antenna master provides at least a majority of the final antenna geometry. For example, the antenna master can provide a plurality of wire segments, such that more than 50% of the final antenna length, being some or all of the wire segments of the antenna master having been interconnected, is derived from the antenna master. In other embodiments, the final antenna length derived from the antenna master can be about 60% or more, about 70% or more, about 80% or more, or about 90% or more. Likewise, to provide specific unique tailoring of the antenna geometry from the antenna master, in embodiments, no more than about 99% of the final antenna length is derived from the antenna master. For example, the final antenna length derived from the antenna master can be no more than about 98%, no more than about 97%, no more than about 95%, or no more than about 90%. Of course, in other embodiments, the antenna master can provide less than 50% of the final antenna length. While such embodiments may increase the production cost by decreasing the mass-produced portion, they may allow for an increased number of possible unique antenna geometries.

The antenna master can be created as a plurality of disconnected wire segments that have been printed via an analog printing process. Thus, the antenna master provides wire segments that can be connected during a subsequent step, such as a digital printing step, in order to produce the finished antenna. Generally, the number of disconnected wire segments that can be provided in the antenna master can range from two or greater to about 100. In an exemplary embodiment, the number of disconnected wire segments is from about 2 to about 20.

The antenna master may have a geometry of any shape and/or pattern, and is not limited to the rectangular configurations as shown in FIG. 1. For example, the overall shape of the antenna master may be polygonal or non-polygonal, symmetrical or non-symmetrical, and angular and/or round. Likewise, the disconnected segments may be printed in random configurations that can be specifically connected in different patterns in the subsequent digital printing step. Moreover, the gaps created by the disconnected segments are not limited to those as shown in FIG. 1. Instead, the number, spacing, and size of gaps created on a single antenna master can vary, and can be regular or not, as desired. For example, the gaps can be located anywhere on the antenna master, and may be located at random or at regularly spaced intervals. The gaps can be of any length or width, and the size of the gaps created by the disconnected segments on the antenna master may or may not be uniform.

The Printing Process

For printing the antenna master, any suitable printing methods may be used. For example, suitable methods include, without limitation, roll-to-roll high volume printing method, such as gravure, rotogravure, flexography, lithography, etching, screenprinting, and the like. In embodiments, the process for printing the antenna master is an analog process, as such processes are typically better suited for high-volume, mass production printing. Such processes thus economically allow the antenna master to be printed, and then a subsequent process can be used to form the final antenna geometries. Of course, digital or slower printing processes can also be used to print the antenna master, although such processes may slow the overall production process.

As desired, the antenna masters may be printed on any suitable substrate. For example, the substrate can be paper, glass art paper, bond paper, paperboard, Kraft paper, cardboard, semi-synthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like. Further, the antenna masters can be printed one to a sheet, such as where the antenna master is being printed onto a packaging material, or they can be printed as a plurality of antenna masters on a single sheet, such as where the antenna masters are printed onto a roll of paper, onto labels, or onto a sheet that will sub subsequently separated into multiple pieces.

Likewise, for printing the interconnections with conductive ink, any suitable printing methods may be used. For example, suitable printing methods include, without limitation, inkjet, thermography, electrophotography, electrography, laser induced transfer, inkjet printing, or a combination thereof. If a laser induced transfer digital printing method is used, exemplary methods of such method are dye sublimation, ablation, melt transfer, or film transfer. In embodiments, the process for interconnecting the wire segments of the antenna master is a digital process, as such processes are typically better suited for printing unique patterns that may be required for interconnecting the wire segments in unique patterns. Such processes thus economically allow the unique antenna geometry to be formed. Because digital printing processes are generally slower and less economical than analog methods such as those used to print the antenna master, it is desired in embodiments to minimize the printing that is done by the digital process. Thus, for example, the digital printing is used only to print the small interconnects rather than the entire antenna geometry. Of course, analog or faster printing processes can also be used to print the antenna interconnects, particularly where a large number of less unique structures may be desired.

Depending on the type of RFID tag being printed, the final step involves digitally printing the dielectric bridge and joining segment to connect the center terminus end and the outer terminus end of the antenna in order to form a loop. Thus, the overall printing process can generally be characterized as a analog-digital printing process. However, if desired, the order of the digital and analog printing steps may be inversed, so that the digital printing step prints the interconnects first, then followed by the analog printing of the antenna master, and finally finished with the digital printing of the bridge area (dielectric and conductive connection).

For printing the antenna master in the analog printing step, any suitable conductive ink nay be used. Examples of such suitable conductive inks include, without limitation, Parmod® inks available from Parelec, Inc. These are generally high-viscosity inks or pastes containing conductive metal flakes that are too thick to be ink jet printed, and are well-suited for analog printing (i.e. gravure, roll-to-roll, etc.). For printing the interconnects in the digital printing step, any suitable conductive ink may be used. Generally, suitable inks can be inks containing graphite, platinum, gold, silver, aluminum, nickel, copper, or a mixture thereof. In an exemplary embodiment, the conductive ink containing copper is used.

In the digital printing step, the number of preprinted disconnected segments connected by a single interconnect can be two or more. Thus, one interconnect may connect multiple wire segments. Moreover, an interconnect need not be placed at the shortest path between two wire segments.

The widths and lengths of the preprinted disconnected segments and interconnects may range from about 0.1 mm to about 10 mm for width, and from about 0.1 mm to about 35 m for length. Moreover, the widths of the preprinted disconnected segments and interconnects may differ, so that the width of the preprinted disconnected segments are thicker than that of the interconnects, or vice versa. Naturally, the lengths of preprinted disconnected segments and interconnects may also differ.

Additionally, the widths and/or lengths of the preprinted disconnected segments and/or the interconnects of a single finished antenna may vary. Therefore, an exemplary antenna may consist of preprinted disconnected segments and/or interconnects of various widths and/or lengths.

Additional Processing Steps

Optionally, additional processing steps, such as any of overcoating, drying and rinsing, alone or in combination, may follow the printing steps.

For the optional overcoating step, any suitable overcoating may be applied after the printing process is completed. For example, a suitable overcoating can be applied to cover and protect the printed metal wires, such as to protect them from abrasion. When so applied, the overcoating can be of any desired thickness, opacity, transparency, or the like.

Additionally, an optional drying step may follow the first and/or the second printing steps. During the drying step, the ink is allowed to dry for about 5 minutes at about 80° C.

Finally, an optional sintering step follows the printing step. This step may be performed at about 130° C. for about 30 minutes.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

EXAMPLES

Printing the Antenna Master

An antenna master (with 1 mm gaps) with a footprint of approximately 4 cm×4 cm square, consisting of 8 turns, with a width of 1 mm lines, and 0.5 mm space between adjacent lines and a total virtual length of 33 m (and virtual resonant frequency of 9 MHz) was printed using a gravure process using a commercially available silver ink on coated photographic paper. The print was allowed to dry for 5 minutes at 80° C. to allow volatile carriers to evaporate off, leaving a paste residue.

Example 1

Printing a 6-Turn Antenna from Antenna Master

The first 6 turns (from the center) were completed on the above-prepared antenna master by printing interconnects in the first 12 gaps, using a Dimatix ink jet printer containing a conductive copper or silver ink. Next, a dielectric bridge was printed over the 6 completed loops, followed by an overlaying bridge wire between the center of the antenna and the terminus of the sixth loop. The length of the 6-turn antenna was 32.698 m, which corresponds to a resonance frequency of 9.17 MHz.

Example 2

Printing a 3-Turn Antenna from Antenna Master

The first 3 turns (from the center) were completed on the above-prepared antenna master by printing over the first 6 gaps, using a Dimatix ink jet printer containing a copper or silver ink. Next, a dielectric bridge was printed over the 3 completed loops, followed by an overlaying bridge wire between the centre of the antenna and the terminus of the third loop. The 3-turn antenna length was 32.564 m, which corresponds to a resonance frequency of 9.21 MHz.

What is claimed is:

1. A method of printing chipless RFID tags with unique features, comprising:
    printing a RFID antenna pattern precursor using a first printing process, wherein the RFID antenna pattern precursor comprises a plurality of disconnected wire segments; and
    printing a conductive ink using a second printing process to interconnect at least two of said plurality of disconnected wire segments, to produce a final RFID antenna with a unique antenna geometry;
    wherein the second printing process is a digital printing process, and the number of disconnected wire segments that are interconnected, and/or the pattern in which they are connected, during the second printing process is customized based on information inputted into the digital printing process, and at the conclusion of the second printing process, less than all of the plurality of disconnected wire segments are interconnected.

2. The method according to claim 1, wherein the first printing process is an analog printing process.

3. The method according to claim 1, wherein the first printing process is selected from the group consisting of gravure, rotogravure, flexography, and screenprinting.

4. The method according to claim 1, wherein the second printing process is inkjet printing.

5. The method according to claim 1, wherein the conductive ink comprises a material selected from the group consisting of graphite, copper, gold, nickel, silver, aluminum, platinum, and mixtures thereof.

6. The method according to claim 1, wherein different ones of the plurality of disconnected wire segments can be interconnected to provide different unique antenna geometries.

7. The method according to claim 1, wherein the different unique antenna geometries are different antenna shapes or different antenna lengths.

8. The method according to claim 7, wherein the different unique antenna geometries correspond to unique resonance frequencies.

9. The method according to claim 1, wherein at least 50% of a final antenna length of the RFID antenna is derived from the disconnected wire segments of the antenna master.

10. The method according to claim 1, wherein the number of disconnected wire segments connected by a single interconnect is two or more.

11. The method according to claim 1, further comprising one or more steps selected from the group consisting of an overcoating step and a drying step.

* * * * *